(12) United States Patent
Li et al.

(10) Patent No.: US 8,536,443 B2
(45) Date of Patent: Sep. 17, 2013

(54) BACK SHEET FOR SOLAR CELL AND METHOD OF MANUFACTURING THE SAME

(75) Inventors: Gang Li, Baoding (CN); Xingming Li, Baoding (CN); Tianren Liu, Baoding (CN); Xuejian Zhang, Baoding (CN); Jing Zou, Baoding (CN)

(73) Assignees: China Lucky Film Group Corporation, Hebei Province (CN); Lucky Film Co., Ltd., Hebei Province (CN)

( * ) Notice: Subject to any disclaimer, the term of this patent is extended or adjusted under 35 U.S.C. 154(b) by 681 days.

(21) Appl. No.: 12/741,093

(22) PCT Filed: Oct. 20, 2008

(86) PCT No.: PCT/CN2008/001761
§ 371 (c)(1),
(2), (4) Date: May 3, 2010

(87) PCT Pub. No.: WO2009/062384
PCT Pub. Date: May 22, 2009

(65) Prior Publication Data
US 2010/0282302 A1    Nov. 11, 2010

(30) Foreign Application Priority Data

Nov. 8, 2007   (CN) .......................... 2007 1 0185202

(51) Int. Cl.
| H01L 31/00 | (2006.01) |
| H01L 31/0203 | (2006.01) |
| H01L 31/0216 | (2006.01) |
| H01L 31/04 | (2006.01) |
| H01L 31/048 | (2006.01) |
| B05D 3/00 | (2006.01) |
| B05D 3/06 | (2006.01) |
| B32B 27/00 | (2006.01) |
| B32B 27/18 | (2006.01) |

(52) U.S. Cl.
USPC ........... 136/252; 136/251; 136/256; 136/259; 427/385.5; 428/323; 428/421

(58) Field of Classification Search
USPC ......................................................... 136/252
See application file for complete search history.

(56) References Cited

U.S. PATENT DOCUMENTS

| 3,133,854 A | 5/1964 | Simms | |
|---|---|---|---|
| 5,139,878 A | 8/1992 | Kim et al. | |
| 6,632,518 B1 | 10/2003 | Schmidt et al. | |
| 7,011,114 B2 * | 3/2006 | Suzuki et al. ................. | 138/137 |
| 2005/0208290 A1 * | 9/2005 | Patel ............................. | 428/323 |
| 2007/0154704 A1 * | 7/2007 | Debergalis et al. ........... | 428/323 |
| 2008/0261037 A1 * | 10/2008 | Snow ............................ | 428/337 |
| 2010/0258162 A1 * | 10/2010 | O'Brien et al. ............... | 136/251 |

FOREIGN PATENT DOCUMENTS

| CN | 101177514 A | 5/2008 |
| EP | 1938967 A1 | 7/2008 |
| EP | 2208755 A1 | 7/2010 |
| JP | 2002246627 A | 8/2002 |
| JP | 2003234484 A | 8/2003 |
| JP | 2007103813 A | 4/2007 |
| WO | 2007010706 A1 | 1/2007 |

OTHER PUBLICATIONS

Ameduri, B., resinsFluoroelastomers: synthesis, properties and applications, 2001, Prog. Polym. Sci., Vo. 26, pp. 105-187.*

* cited by examiner

*Primary Examiner* — Jeffrey T Barton
*Assistant Examiner* — Tae-Sik Kang
(74) *Attorney, Agent, or Firm* — The Webb Law Firm

(57) ABSTRACT

The present invention relates to a back sheet for solar cell and a method of manufacturing the same. The back sheet for solar cell comprises a substrate and a fluoropolymer layer, wherein the components by weight of the fluoropolymer layer are as follows: 25~45 parts of fluororesin; 1.5~3 parts of modified resin; 0.5~3 parts of polymeric filler; 0.1~1 parts of inorganic filler; and 50~70 parts of solvent. The back sheet for solar cell provided by the present invention has low cost and excellent performances, such as high peeling strength, good waterproof performance, and good weathering resistance. The method of manufacturing the back sheet for solar cell provided by the present invention is simple in process, and thus can achieve continuous industrial production.

14 Claims, No Drawings

BACK SHEET FOR SOLAR CELL AND METHOD OF MANUFACTURING THE SAME

FIELD OF THE INVENTION

The present invention relates to a back sheet for solar cell and a method of manufacturing the same.

BACKGROUND OF THE INVENTION

As a green alternative for the traditional method of generating electrical energy, a photovoltaic cell module is employed to generate electricity by taking advantage of sunlight. The photovoltaic cell module is formed by assembling a variety of semiconductor component systems, and thus must be protected to alleviate the impact and damage from the environment such as moisture, oxygen, and ultraviolet. A typical structure of the photovoltaic cell module comprises a silicon wafer and protective layers laminated on both sides of the silicon wafer, wherein said protective layer may be a glass or a plastic film. Because of its excellent strength, weathering resistance, ultraviolet resistance and humidity insulation properties, back sheet formed by laminating a fluoropolymer film and polyester (PET) films plays an important role in the photovoltaic cell module. The traditional production of a back sheet involves adhering a pre-manufactured fluoropolymer film, especially a polyvinyl fluoride (PVF) film, to a polyester (PET) substrate, typically onto both sides of the PET film so as to form a sandwich-like structure. When a fluoropolymer film, e.g. a PVF film, is used as the back sheet for a photovoltaic cell module, its properties significantly improve the service life of the module, so that the service life of the module is ensured to be as long as 25 years.

However, it is difficult to obtain a sufficient adhesion between the pre-manufactured fluoropolymer film and the polymer substrate, such that a peel-off never occurs even after a few years of exposure to the outdoors. In the prior art, such as U.S. Pat. Nos. 3,133,854, 5,139,878 and 6,632,518, methods are described to obtain a durable back sheet having a laminated structure by pre-coating a ground layer or an adhesive layer on the substrate before adhering the fluoropolymer film. However, all of these methods need to provide at least one adhesive layer or ground layer prior to the actual laminating step, and then in the laminating step, the lamination is achieved by providing heat and pressure. Thus, the method comprising laminating a pre-manufactured fluoropolymer film involves quite a lot of steps and a relatively high cost. Meanwhile, the pre-manufactured fluoropolymer film must have a sufficient thickness to meet the requirements of its strength during the adhering and the post-processing process, which renders the actual thickness of the film thicker than that is necessary to provide the protection performance, resulting in waste of the expensive fluororesin film and increased cost of the product.

SUMMARY OF THE INVENTION

One technical problem to be solved by the present invention is to provide a back sheet for solar cell without using any additional ground layer or adhesive layer, which is low in cost and excellent in performance.

Another technical problem to be solved by the present invention is to provide a simple method of manufacturing a back sheet for solar cell, which can realize a continuous industrial production.

To achieve the above objects, the present invention provides the following technical solutions.

The present invention provides a back sheet for solar cell comprising a substrate and a fluoropolymer layer, wherein the components of a fluoropolymer liquid coating composition formulation for preparing the fluoropolymer layer and the parts by weight thereof are as follows:

| | |
|---|---|
| Fluororesin | 25~45 parts; |
| Modified resin | 1.5~3 parts; |
| Polymeric filler | 0.5~3 parts; |
| Inorganic filler | 0.1~1 parts; |
| Solvent | 50~70 parts. |

In the back sheet for solar cell described above, said fluorinated resin is a homopolymer of vinylidene fluoride, tetrafluoroethylene, or hexafluoropropylene, or a copolymer thereof.

In the back sheet for solar cell described above, said modified resin is poly(vinylidene fluoride-tetrafluoroethylene-hexafluoropropylene) resin modified by a carboxylic group, a sulfonic group, an azacyclopropane group, an isocyanate group, an epoxy group, an amino group, a hydroxyl group, or an active methylene group.

In the back sheet for solar cell described above, said fluoropolymer layer includes an inorganic filler selected from the oxides of titanium, aluminum, tin, or silicon.

In the back sheet for solar cell described above, said solvent is one or more of toluene, methyl ethyl ketone, ethyl acetate, and butyl acetate.

In the back sheet for solar cell described above, the thickness of said fluoropolymer layer is 25~50 μm.

In addition, the present invention further provides a method of manufacturing the above mentioned back sheet for solar cell provided by the present invention, which involves coating a fluoropolymer layer on the surface of the substrate and then curing to obtain the back sheet for solar cell.

Polyester is generally used as substrate for a back sheet of solar cell, for example, polyethylene terephthalate (PET), polyethylene naphthalate (PEN) or a double layered co-extruded product thereof. The substrate can be transparent, white, or black according to the various purposes.

In order to make a better use of the characteristics of fluoropolymer, such as weathering resistance, solvent resistance, and insulation properties, the fluororesin used in the present invention may be a homopolymer of vinylidene fluoride, tetrafluoroethylene, or hexafluoropropylene, or a copolymer thereof, and preferably includes:

Polyvinylidene fluoride (PVDF) resin;

Poly(vinylidene fluoride-tetrafluoroethylene) (PVDF-PTFE) resin;

Poly(vinylidene fluoride-hexafluoropropylene) (PVDF HFP) resin;

Poly(vinylidene fluoride-tetrafluoroethylene-hexafluoropropylene) (PVDF-PTFE-HFP) resin.

The fluoropolymer layer of the present invention contains modified resin. By using such modified resin, the adhesion between the fluoropolymer coating and the substrate can be significantly improved to such a bonding strength that the adhesion between the fluoropolymer coating and the substrate can be guaranteed without an additional ground layer or adhesive layer to meet the requirement of a service life of more than 25 years. The modified resin useful for the present invention is a homopolymer of, or a copolymer of two or three of, vinylidene fluoride, tetrafluoroethylene, or hexafluoropropylene, modified by a carboxylic group, a sulfonic group, an azacyclopropane group, an isocyanate group, an epoxy group, an amino group, a hydroxyl group, an active methylene group or a mixture thereof, and preferably the modified resin useful for the present invention is selected from the group consisting of the following modified resins:

Amino-modified poly(vinylidene fluoride-tetrafluoroethylene-hexafluoropropylene) resin;

Hydroxyl-modified poly(vinylidene fluoride-tetrafluoroethylene-hexafluoropropylene) resin;

Azacyclopropane-modified poly(vinylidene fluoride-tetrafluoroethylene-hexafluoropropylene) resin.

To further enhance the strength of the fluoropolymer layer, the fluoropolymer layer of the present invention contains polymeric filler, which can be acrylate polymer particles, vinyl polymer particles, fluorine-containing vinyl polymer particles, and polyamide particles, having an average particle size of 1~4 μm. The particles can be a regular sphere, or a sheet, a rod, or other irregular shapes; the particle size can be uniformly distributed, but can also be irregularly distributed.

To enhance weathering resistance, solvent resistance, and insulation properties of the fluoropolymer layer, the fluoropolymer layer of the present invention contains inorganic filler selected from one or more of the oxides of titanium, aluminum, tin, and silicon, such as quartz particles, mica particles, and titanium dioxide particles.

Solvent suitable for the present invention can be one or more of toluene, methyl ethyl ketone, ethyl acetate, and butyl acetate.

In the present invention, the coating liquid for the fluoropolymer layer is initially prepared. Said coating liquid comprises the fluororesin, the modified resin, the polymeric filler, and the inorganic filler listed above, and the viscosity of the composition is adjusted by the solvent to a scope appropriate for carrying out the coating. The components of a fluoropolymer liquid coating composition formulation for preparing the fluoropolymer layer and the parts by weight thereof are as follows:

| Fluororesin | 25~45 parts; |
|---|---|
| Modified resin | 1.5~3 parts; |
| Polymeric filler | 0.5~3 parts; |
| Inorganic filler | 0.1~1 parts; |
| Solvent | 50~70 parts. |

The back sheet for solar cell provided by the present invention can be manufactured by the following method:

Unfolding the substrate and coating the fluoropolymer layer onto the surface of the substrate, and then curing to obtain the back sheet for solar cell.

The curing method adopted in the method of manufacturing a back sheet for solar cell provided by the present invention includes curing by crosslinking the fluoropolymers through ultraviolet irradiation, or curing by crosslinking the fluoropolymers through high-energy radiation using X-ray, cobalt 60, an electrostatic accelerator, or a high-power electron linear accelerator as the irradiation source.

In the method of manufacturing a back sheet for solar cell provided by the present invention, the fluoropolymer layer can be applied onto the substrate by immersion coating method, air blade coating method, blade coating method, gravure coating method, slit coating method, etc.

In the back sheet for solar cell provided and/or manufactured by the present invention, the thickness of the fluoropolymer layer is 25~50 μm, preferably 30~40 μm.

Compared with the prior art, the present invention has the following beneficial effects.

Because the additional ground layer or adhesive layer is no longer necessary according to the present invention, the back sheet for solar cell provided by the present invention has low cost and excellent performance, as well as high peeling strength, good waterproof performance, and good weathering resistance.

The method of manufacturing a back sheet for solar cell provided by the present invention is simple in process, and thus can achieve continuous industrial production.

EMBODIMENTS FOR CARRYING OUT THE INVENTION

The present invention is further illustrated below, without any limitation, by referring to specific examples thereof.

Example 1

| Polyvinylidene fluoride (available from Aldrich) | 25 parts |
|---|---|
| Hydroxyl-modified poly(vinylidene fluoride - tetrafluoroethylene - hexafluoropropylene) resin (available from China Lucky Film Group Corporation) | 3 parts |
| PTFE (available from Solvay Solexis) | 2 parts |
| Titanium dioxide powder (available from DU PONT) | 0.2 part |
| Methyl ethyl ketone | 20 parts |
| Ethyl acetate | 50 parts |

Added into a container equipped with a stirring device were 20 parts of methyl ethyl ketone and 50 parts of ethyl acetate. Started stirring, and 25 parts of polyvinylidene fluoride, 3 parts of hydroxyl-modified poly(vinylidene fluoride-tetrafluoroethylene-hexafluoropropylene) resin, 2 parts of PTFE powder and 0.2 part of titanium dioxide powder were added successively. The resultant mixture was stirred for 60 minutes to obtain the coating liquid for the fluoropolymer layer. Afterwards, the coating liquid was applied to a PET substrate by blade coating method, then dried by hot air. Thus, a back sheet for solar cell is obtained with a fluoropolymer layer having a thickness of 25 μm, and the performance thereof is tested.

Similarly, the substrate having a fluoropolymer layer applied on one side thereof was turned over, and further had a second fluoropolymer layer applied on the other side according to the above steps.

Example 2

| PTFE (available from Aldrich) | 40 parts |
|---|---|
| Amino-modified poly(vinylidene fluoride - tetrafluoroethylene - hexafluoropropylene) resin (available from China Lucky Film Group Corporation) | 2 parts |
| Polyamide particles (available from Solvay Solexis) | 3 parts |
| Quartz particles (available from DU PONT) | 0.3 part |
| Butyl acetate | 55 parts |

Added into a container equipped with a stirring device were 55 parts of butyl acetate. Started stirring, and 40 parts of PTFE, 2 parts of amino-modified poly(vinylidene fluoride-tetrafluoroethylene-hexafluoropropylene) resin, 3 parts of polyamide particles and 0.3 part of quartz particles were successively added. The resultant mixture was stirred for 50 minutes to obtain the coating liquid for the fluoropolymer layer. Afterwards, the coating liquid was applied to a PEN substrate by immersion coating method, then dried by hot air. Thus, a back sheet for solar cell is obtained with a fluoropolymer layer having a thickness of 40 μm, and the performance thereof is tested.

Similarly, the substrate having a fluoropolymer layer applied on one side thereof was turned over, and further had a second fluoropolymer layer applied on the other side according to the above steps.

Example 3

| | |
|---|---|
| Poly(vinylidene fluoride - hexafluoropropylene) (available from 3M Dyneon) | 45 parts |
| Azacyclopropane-modified poly(vinylidene fluoride - tetrafluoroethylene - hexafluoropropylene) resin (available from China Lucky Film Group Corporation) | 2.5 parts |
| Polyacrylate polymer particles (available from Solvay Solexis) | 2.5 parts |
| Mica particles (by DU PONT) | 0.1 part |
| Toluene | 50 parts |

Added into a container equipped with a stirring device were 50 parts of toluene. Started stirring, and 45 parts of poly(vinylidene fluoride-hexafluoropropylene), 2.5 parts of azacyclopropane-modified poly(vinylidene fluoride-tetrafluoroethylene-hexafluoropropylene) resin, 2.5 parts of polyacrylate polymer particles and 0.1 part of mica particles were successively added. The mixture was stirred for 80 minutes to obtain the coating liquid for the fluoropolymer layer. Afterwards, the coating liquid was applied to a PET substrate by gravure coating method, then irradiated by ultraviolet. Thus, a back sheet for solar cell is obtained with a fluoropolymer layer having a thickness of 50 μm, and the performance thereof is tested.

Similarly, the substrate having a fluoropolymer layer applied on one side thereof was turned over, and further had a second fluoropolymer layer applied on the other side according to the above steps.

Example 4

| | |
|---|---|
| Poly(vinylidene fluoride - hexafluoropropylene) (available from 3M Dyneon) | 30 parts |
| Sulfonic group-modified poly(vinylidene fluoride - tetrafluoroethylene - hexafluoropropylene) resin (available from China Lucky Film Group Corporation) | 1.5 parts |
| PTFE powder (by Solvay Solexis) | 0.5 parts |
| Titanium dioxide powder (by DU PONT) | 1 part |
| Ethyl acetate | 30 parts |
| Butyl acetate | 35 parts |

Added into a container equipped with a stirring device were 30 parts of ethyl acetate and 35 parts of butyl acetate. Started stirring, and 30 parts of poly(vinylidene fluoride-hexafluoropropylene), 1.5 parts of sulfonyl group-modified poly(vinylidene fluoride-tetrafluoroethylene-hexafluoropropylene) resin, 0.5 parts of PTFE powder and 1 part of titanium dioxide powder were successively added. The resultant mixture was stirred for 60 minutes to obtain the coating liquid for the fluoropolymer layer. Afterwards, the coating liquid was applied to a PEN substrate by blade coating method, and then cured by thermal radiation. Thus, a back sheet for solar cell is obtained with a fluoropolymer layer having a thickness of 30 μm, and the performance thereof is tested.

Similarly, the substrate having a fluoropolymer layer applied on one side thereof was turned over, and further had a second fluoropolymer layer applied on the other side according to the above steps.

Example 5

| | |
|---|---|
| Poly(vinylidene fluoride - tetrafluoroethylene - hexafluoropropylene) (available from China Lucky Film Group Corporation) | 45 parts |
| Carboxyl-modified poly(vinylidene fluoride - tetrafluoroethylene - hexafluoropropylene) resin (available from China Lucky Film Group Corporation) | 3.0 parts |
| Polyamide particles (available from Solvay Solexis) | 1.5 parts |
| Mica particles (available from DU PONT) | 0.5 part |
| Butyl acetate | 50 parts |

Added into a container equipped with a stirring device were 50 parts of butyl acetate. Started stirring, and 45 parts of poly(vinylidene fluoride-tetrafluoroethylene-hexafluoropropylene), 3 parts of carboxyl-modified poly(vinylidene fluoride-tetrafluoroethylene-hexafluoropropylene) resin, 1.5 parts of polyamide particles and 0.5 part of mica particles were successively added. The mixture was stirred for 60 minutes to obtain the coating liquid for the fluoropolymer layer. Afterwards, the coating liquid was applied to a PET substrate by blade coating method, and cured by thermal radiation. Thus, a back sheet for solar cell is obtained with a fluoropolymer layer having a thickness of 50 μm, and the performance thereof is tested.

Similarly, the substrate having a fluoropolymer layer applied on one side thereof was turned over, and further had a second fluoropolymer layer applied on the other side according to the above steps.

Comparative Example

A thermosetting adhesive (by Hexion) was applied on both sides of a PET substrate (available from China Lucky Film Group Corporation) having a thickness of 75 μm, and PVF films having a thickness of 38 μm (available from DU PONT) were hot pressed to adhere thereupon. Thus, a conventional back sheet for solar cell is obtained as a comparative sample.

| | vapor transmission rate test ($g/m^2 \cdot 24\ h$) | weathering resistance test | coating adhesion test (peel-off area) |
|---|---|---|---|
| Example 1 | 1.98 | passed | 0 |
| Example 2 | 2.03 | passed | 0 |
| Example 3 | 1.85 | passed | 0 |
| Example 4 | 1.78 | passed | 0 |
| Example 5 | 1.94 | passed | 0 |
| Comparative Example | 2.02 | passed | 0 |

In the above table:

1. Vapor Transmission Rate Test:

The vapor transmission rate test was conducted using a Mocon Permatron-W 700 device according to the ATSM 1249 standard.

2. Weathering Resistance Test:

The weathering resistance test was conducted using a Q-Sun Xe-3-H-type xenon lamp weathering resistance aging chamber according to the ISO 4892-2 standard.

3. Coating Adhesion Test

The coating adhesion test was conducted according to the ASTM 3359 standard.

A cross-cut tester was used to cut out cross lattice patterns on the coating, the cut going down until the substrate. Test unit comprising 100 small squares is thus obtained.

A PSA467 tape (available from 3M) was applied to the surface of the test area closely, with the longitudinal direction thereof being parallel to one of the cuts, and was attached tightly by force. Then peeled off the tape swiftly and fiercely in the direction forming a 0 degree angle with the surface of the coating. Changes in the surface of the coating were observed, and the peel-off of the coating of any area was determined as failed in the peel strength.

It could be seen from the data in the table that, compared with the comparative sample of the back sheet for solar cell obtained by a conventional method, the fluoropolymer film provided by the present invention could fully meet the requirements of a back sheet of a photovoltaic module product.

We claim:

1. A back sheet for solar cell comprising a substrate and a fluoropolymer layer, wherein components of a fluoropolymer liquid coating composition formulation for preparing the fluoropolymer layer by weight consist of:

| | |
|---|---|
| Fluororesin | 25~45 parts; |
| Modified resin | 1.5~3 parts; |
| Polymeric filler | 0.5~3 parts; |
| Inorganic filler | 0.1~1 part; |
| Solvent | 50~70 parts; | wherein said modified resin is poly(vinylidene fluoride-tetrafluoroethylene-hexafluoropropylene) resin modified by a carboxylic group, a sulfonic group, an azacyclopropane group, an isocyanate group, an epoxy group, an amino group, a hydroxyl group, or an active methylene group.

2. The back sheet for solar cell according to claim 1, wherein said fluororesin is a homopolymer of vinylidene fluoride, tetrafluoroethylene, or hexafluoropropylene, or a copolymer thereof.

3. The back sheet for solar cell according to claim 1, wherein said inorganic fillers comprise one or more of the oxides of titanium, aluminum, tin, and silicon.

4. The back sheet for solar cell according to claim 2, wherein said inorganic fillers comprise one or more of the oxides of titanium, aluminum, tin, and silicon.

5. The back sheet for solar cell according to claim 1, wherein said solvent is one or more of toluene, methyl ethyl ketone, ethyl acetate, and butyl acetate.

6. The back sheet for solar cell according to claim 2, wherein said solvent is one or more of toluene, methyl ethyl ketone, ethyl acetate, and butyl acetate.

7. The back sheet for solar cell according to claim 1, wherein the thickness of said fluoropolymer layer is 25~50 μm.

8. The back sheet for solar cell according to claim 2, wherein the thickness of said fluoropolymer layer is 25~50 μm.

9. A method of manufacturing the back sheet for solar cell according to claim 1, wherein the fluoropolymer layer is coated on the surface of the substrate and cured to obtain the back sheet for solar cell.

10. The method of manufacturing the back sheet for solar cell according to claim 9, wherein the fluoropolymer layer is applied onto the substrate by immersion coating method, air blade coating method, blade coating method, gravure coating method, or slit coating method.

11. The method of manufacturing the back sheet for solar cell according to claim 9, wherein the fluoropolymer layer is cured by crosslinking the fluoropolymer layer through ultraviolet irradiation, or cured by crosslinking the fluoropolymers through high-energy radiation using X-ray, cobalt 60, an electrostatic accelerator, or a high-power electron linear accelerator as an irradiation source.

12. The method of manufacturing the back sheet for solar cell according to claim 9, wherein the thickness of said fluoropolymer layer on the substrate is 25~50 μm after curing.

13. The method of manufacturing the back sheet for solar cell according to claim 10, wherein the thickness of said fluoropolymer layer on the substrate is 25~50 μm after curing.

14. The method of manufacturing the back sheet for solar cell according to claim 11, wherein the thickness of said fluoropolymer layer on the substrate is 25~50 μm after curing.

* * * * *

UNITED STATES PATENT AND TRADEMARK OFFICE
CERTIFICATE OF CORRECTION

PATENT NO. : 8,536,443 B2  Page 1 of 1
APPLICATION NO. : 12/741093
DATED : September 17, 2013
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 679 days.

Signed and Sealed this

Fifteenth Day of September, 2015

Michelle K. Lee
*Director of the United States Patent and Trademark Office*